United States Patent [19]
Yokoyama et al.

[11] Patent Number: 6,130,154
[45] Date of Patent: Oct. 10, 2000

[54] SEMICONDUCTOR DEVICE AND FABRICATION PROCESS THEREOF

[75] Inventors: Takashi Yokoyama; Yoshiaki Yamada; Koji Kishimoto, all of Tokyo, Japan

[73] Assignee: NEC Corporation, Tokyo, Japan

[21] Appl. No.: 09/049,931

[22] Filed: Mar. 30, 1998

[30] Foreign Application Priority Data

Mar. 31, 1997 [JP] Japan .................................. 9-080672

[51] Int. Cl.[7] ........................ H01L 21/4763; H01L 21/31
[52] U.S. Cl. .................... 438/627; 438/624; 438/625; 438/636; 438/648; 438/783
[58] Field of Search .................................. 438/624, 625, 438/627, 636, 648, 783

[56] References Cited

U.S. PATENT DOCUMENTS

| | | | |
|---|---|---|---|
| 5,827,778 | 10/1998 | Yamada | 438/637 |
| 5,960,310 | 9/1999 | Jeong | 438/622 |
| 5,960,317 | 9/1999 | Jeong | 438/633 |

FOREIGN PATENT DOCUMENTS

| | | |
|---|---|---|
| 6-163538 | 6/1994 | Japan . |
| 6-302593 | 10/1994 | Japan . |
| 7-74245 | 3/1995 | Japan . |
| 9-139428 | 5/1997 | Japan . |

OTHER PUBLICATIONS

Woo Sik Yoo, et al., "Intermetal Dielectric Gap Fill by Plasma Enhanced Chemical Vapor Deposited Fluorine–Doped Silicon Dioxide Films", *Jpn. J. Appl. Phys.*, vol. 35, Part 2, No. 3A, pp. 273–275, Mar. 1996.

*Primary Examiner*—John F. Niebling
*Assistant Examiner*—Alexander G. Ghyka
*Attorney, Agent, or Firm*—Foley & Lardner

[57] ABSTRACT

A semiconductor device with satisfactory bonding avility of a plasma SiOF oxide layer on a wiring and satisfactory burying ability for buring wiring space portions. The semiconductor device is deposited by forming a metal layer to be a base of wiring on a semiconductor substrate, forming an anti-reflection layer of a refractory metal or compound thereof, on the metal layer, and forming an insulation layer on the anti-reflection layer. There after, the insulation layer is patterned and a wiring is patterned by etching the anti-reflection layer and the metal layer to be the base of the wiring with taking the patterned insulation layer as a mask with leasing the anti-reflection layer and the insulation layer on the wiring. Subsequently, the patterned wiring is buried with an SiOF layer as an Si oxide layer containing fluorine, together with the anti-reflection layer and the insulation layer on the upper surface.

14 Claims, 7 Drawing Sheets

SEMICONDUCTOR DEVICE AND FABRICATION PROCESS THEREOF

BACKGROUND OF THE INVENTION

1. Field of the Invention

The present invention relates generally to a semiconductor device having a memory function, a logic function and various functions specific to semiconductor materials, and a fabrication process thereof. More specifically, the invention relates to a multiplayer interconnection structure of such semiconductor device and a fabrication process thereof.

2. Description of the Related Art

Associating with refining and increasing of package density of a semiconductor integrated circuit in the recent years, refining and employment of multilayer structure of wiring has progressed. In a logic type semiconductor device, since shortening of a propagation delay of signal is essential, reduction of dielectric constant of an interlayer insulation layer is demanded. Therefore, it has been studied to introduce a fluorine containing gas using a high density plasma CVD (Chemical Vapor Deposition) device (HDP-CVD) to deposit SiOF ($\epsilon \approx 3.3$) as a low dielectric constant layer.

When the SiOF layer as the low dielectric constant layer is used, it becomes possible to satisfactorily bury even in an interval between wiring less than or equal to 0.25 $\mu$m, which is not possible to bury in case of a Si oxide layer formed by a parallel plate plasma CVD method (PE-CVD method) using TEOS (tetraethoxy silane) or the like, which has been widely used conventionally, as a material gas.

On the other hand, in addition to the HDP-CVD method, there is a method for forming the SiOF layer by addition of an etching type gas containing fluorine upon forming the Si oxide layer by the foregoing parallel plate plasma CVD method (PE-CVD method) (for example, Japanese Unexamined Patent Publication (Kokai) No. Heisei 6-302593). Even in this method, since etching is progressed simultaneously with deposition of the layer, good burying ability can be achieved so that the SiOF layer can be buried even in a wiring interval which is smaller in comparison with Si oxide layer.

For good burying ability, study has been made for application of a memory type device, such as a dynamic random access memory (DRAM) having a high wiring pitch.

As wiring of the semiconductor device, an Al alloy has been widely used. However, upon formation of Al wiring, TiN layer as an anti-reflection layer preventing surface reflection during lithography, is frequently formed. A structure where the SiOF layer is directly deposited on a wiring having the upper surface covered with TiN, is preferred in view of lowering of the dielectric constant. However, due to low bonding ability between TiN and the SiOF layer, a problem is encountered in that peeling is easily caused at the interface between the layers. While burying ability becomes higher at higher fluorine concentration in the SiOF layer, the problem of peeling becomes more significant at higher fluorine concentration in the SiOF layer.

Separately from the foregoing problem, in the SiOF layer having high fluorine concentration, fluorine may be dispersed during a process, such as heat treatment or the like, to possibly cause corrosion by reaction with Al type wiring. For the measure of this problem, there has been proposed a method to grow Si oxide layer before growth of the SiOF layer (for example, Japanese Unexamined Patent Publication No. Heisei 7-74245). Section of the prior art employing this method is shown in FIG. 6. On a BPSG layer 602 of a Si semiconductor substrate, a Si oxide layer 604 with no fluorine added is formed in a thickness of 100 nm by a PE-CVD method, on an Al wiring 603, using TEOS and $O_2$. By forming the SiOF layer 605 to a thickness of 500 nm on the Si oxide layer 604 using TEOS, $O_2$ and $NF_3$, the interval between Al wiring is filled. In this method, diffusion of fluorine in the SiOF layer is prevented by the Si oxide layer and the bonding ability of the anti-reflection layer TiN and the SiOF layer can be improved.

However, by growth of Si oxide layer, an overhang shape 606 is formed between the wiring as shown in FIG. 6 to cause difficulty in burying the SiOF layer in the fine wiring 607. Particularly, coverage is lowered in the narrow space portion less than or equal to 0.25 $\mu$m to cause void 608 or so forth between the wiring to be a cause of degradation of reliability of the wiring. Also, due to the double layer structure of the Si oxide layer and the SiOF layer having a high relative dielectric constant, the dielectric constant becomes higher in comparison with a single SiOF layer.

The problems in the prior art is low reliability of wiring due to the possibility of corrosion of the Al type wiring by fluorine diffusion and the occurrence of peeling in the interface with TiN when the SiOF layer is directly grown on a first wiring having TiN as the anti-reflection layer.

The reason is that a fluoride of Ti is formed on the surface of the TiN by the SiOF grown layer or fluorine in the SiOF layer. There is a low bonding ability between the fluoride and the SiOF layer, and furthermore, since the Al type wiring and plasma SiOF oxide layer are in direct contact, fluorine may be diffused by heat treatment or so forth to react with Al type substance.

The second problem is that when a Si oxide layer is formed below the SiOF layer, despite of the fact that the SiOF layer is used as an insulation layer, the burying ability to the narrow wiring space portion is not high. Furthermore, it is not possible to achieve satisfactory lowering of the dielectric constant as a whole of the insulation layer.

The reason is that Si oxide layer is deposited immediately before deposition of the SiOF layer. Coverage of Si oxide layer is not good and is forms an overhang like configuration to lower the burying ability of the subsequently formed the SiOF layer within the wiring space portion, and by stacking with Si oxide layer having high relative dielectric constant, dielectric constant of the overall interlayer insulation layer cannot be lowered satisfactorily.

SUMMARY OF THE INVENTION

It is an object of the present invention to provide a semiconductor device which can improve bonding ability with a metal wiring, prevent corrosion of wiring, improve burying ability between fine wiring, achieve low dielectric constant in overall interlayer insulation layer and achieve speeding up of the device with making a capacity between wiring small.

According to one aspect of the present invention, a semiconductor device comprises:

wiring formed on a semiconductor substrate by etching;

an insulation layer serving as a mask for etching in formation of the wiring, the insulation layer being formed only on the surface above the wiring via an anti-reflection layer; and a Si oxide layer containing fluorine and burying the anti-reflection layer and the insulation layer therein.

The insulation layer on the wiring may be an Si oxide layer or an Si nitride layer.

The anti-reflection layer on the wiring may be formed of a refractory metal or a compound thereof, such as any one of Ti, W, TiN and TiW or a laminated structure thereof. A major component of the wiring may be Al or Cu.

According to another aspect of the present invention, a fabrication process of a semiconductor device comprises:

a metal layer forming step of forming a metal layer to be a base of wiring on a semiconductor substrate;

an anti-reflection layer forming step of forming an anti-reflection layer of a refractory metal or compound thereof, on the metal layer;

an insulation layer forming step of forming an insulation layer on the anti-reflection layer;

an insulation layer patterning step of patterning the insulation layer;

a wiring patterning step of performing patterning of the wiring by etching the anti-reflection layer and the metal layer to be the base of the wiring with taking the patterned insulation layer as a mask with leasing the anti-reflection layer and the insulation layer on the wiring; and an SiOF layer burying step of burying the patterned wiring with an SiOF layer as an Si oxide layer containing fluorine, together with the anti-reflection layer and the insulation layer on the upper surface.

The insulation layer patterning step may comprise a step of performing patterning of the insulation layer with taking a photoresist as a mask, and a step of removing the photoresist. The anti-reflection layer can be patterned simultaneously with the insulation layer.

The insulation layer forming step may form the Si oxide layer or the Si nitride layer by way of sputtering or CVD method.

The anti-reflection layer forming step may deposit any one of Ti, W, TiN and TiW by way of sputtering or a plurality components selected among Ti, W, TiN and TiW by way of sputtering.

The metal layer forming step may deposit a metal containing Al as a major component, and the wiring patterning step is performed by dry etching with a gas under a condition where a tapered side wall is formed with being formed a protective layer on the side wall of the wiring metal by etching.

The SiOF burying step is performed by a plasma CVD method or a high density plasma CVD method. At this time, a silane type gas or tetraethyl orthosilicate (TEOS), a fluorine type gas or triethoxy fluorosilane (TEFS), and oxygen are taken as source gases. When fluorine type gas is used, at least one of $CF_4$, $C_2F_6$, $NF_3$, $SiF_4$ is used.

The fluorine concentration in the SiOF layer is preferably higher than or equal to 5 at %.

In the present invention, on the semiconductor substrate formed with the transistors or so forth, the metal, for example Al alloy, to be the first wiring layer is sputtered. On the first wiring layer, TiN layer to serve as the anti-reflection layer upon lithography. Also on the anti-reflection layer, the Si Oxide layer is deposited by the sputtering method or the plasma CVD method. In order to form targeted shape of wiring, a photoresist is applied and the resist is patterned by a known lithographic process. With taking this photoresist as a mask, the Si oxide layer is etched. At this time, TiN layer may also be etched subsequently. As the etching gas, gas system of $CHF_3$, $CF_4$, Ar and so forth may be used. When this gas system is used, Si oxide later and the TiN as base layer therebelow are normally etched. However, the Al type metal is not etched to terminate etching on the surface of the Al type metal. By slightly modifying the gas system or mixture ratio, it is also possible to terminate etching at the surface of TiN.

Subsequently, with taking the patterned Si oxide layer as a mask, Al type metal wiring is etched. By introducing $BCl_3$, $Cl_2$, $N_2$ type gas as the etching gas and by using the high density plasma source, such as ICP or so forth, etching is performed. In this step, the surface of the Si oxide layer is slightly etched simultaneously with etching of the Al type metal. The side wall protective layer consisted of Al, Si, O and N is formed on the side wall of the wiring. When this gas type is used, deposition amount of the side wall protective layer of the wiring becomes variable depending upon $N_2$ amount. By variation of deposition amount, the taper angle of the side wall of the wiring can be varied. By the taper angle of the wiring, the burying property of the SiOF layer is significantly affected. By adjusting the taper angle with $N^2$ amount, burying ability of the SiOF layer can be improved to make it possible to bury the fine interval between wiring to form no void.

Furthermore, the side wall protective layer also serves as a barrier preventing diffusion of fluorine in the SiOF layer. Immediately before deposition of the SiOF layer in this effect, it becomes unnecessary to deposit the Si oxide layer. Therefore, high burying ability and the SiOF with low dielectric constant can be certainly formed.

According to the present invention, since Si oxide later is formed on the TiN wiring, the TiN layer and the plasma SiOF layer are not in direct contact. By this, good bonding ability of plasma SiOF oxide layer can be certainly provided on the wiring.

BRIEF DESCRIPTION OF THE DRAWINGS

The present invention will be understood more fully from the detailed description given herebelow and from the accompanying drawings of the preferred embodiment of the present invention, which, however, should not be taken to be limitative to the invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessarily obscure the present invention.

[First Embodiment]

FIGS. 1A to 1E are sections of the first embodiment of the present invention showing a fabrication process in a sequential order of process steps.

Figure 1A:
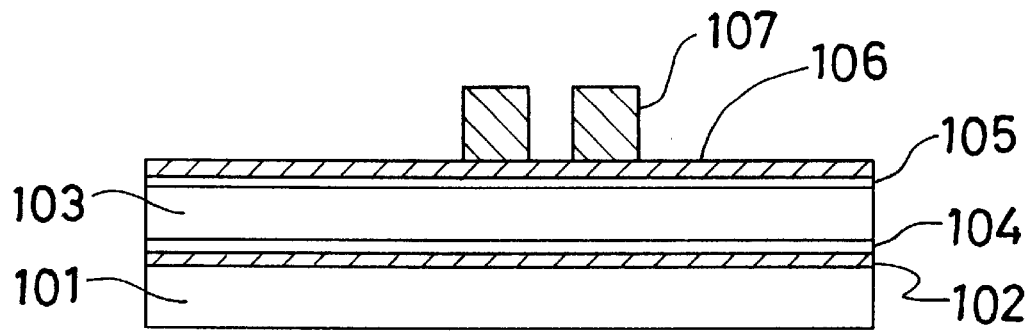
FIGS. 1A to 1E are sections of the first embodiment of the present invention showing a fabrication process in a sequential order of process steps.

As shown in FIG. 1A, on an Si oxide layer 102 on an Si substrate formed with transistors and so forth, an Al type metal 103 for wiring is formed in a thickness of 400 to 500 nm by way of sputtering. Below the wiring 103, Ti, TiN, TiN/Ti or the like is deposited in a thickness of 100 to 200 nm as a junction barrier metal layer 104. On the Al type metal layer 103, TiN, TiN/Ti or the like as an anti-reflection layer 105 upon lithography is formed. The layer thickness of TiN is in a range of 25 to 100 nm. Subsequently, an Si oxide layer 106 is formed in a thickness of 150 to 300 nm by way of sputtering or CVD. In order to form a wiring pattern, a photoresist is applied on the Si oxide layer 106 in a thickness of about 1 $\mu$m. Then, by a known lithographic process, patterning 107 is effected for the photoresist.

Figure 1B:
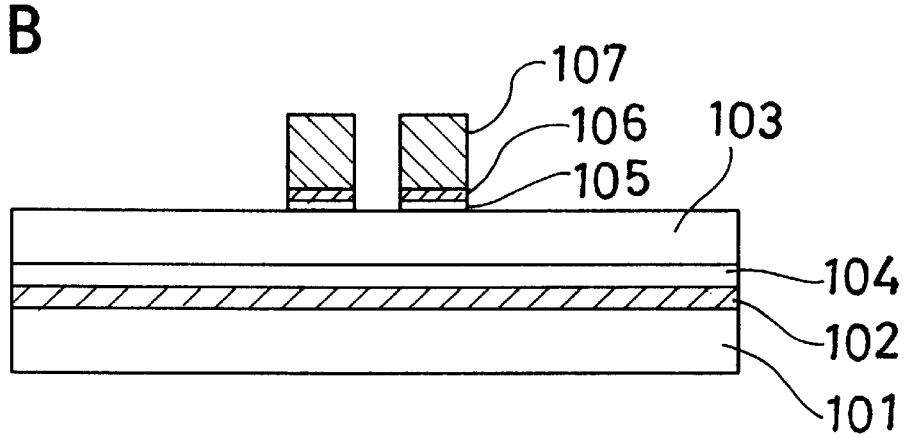

Next, as shown in FIG. 1B, taking the photoresist pattern as a mask, a Si oxide layer 106 and the anti-reflection layer 105 are etched. For etching the Si oxide layer 106, 10 to 20 SCCM of $CHF_3$, 10 to 20 SCCM of $CF_4$ and 150 to 250 SCCM of Ar are introduced as gas system, etching is performed under RF (high frequency) power of 700 to 900 W. Since the Al type metal is not etched with this gas system, the etching is terminated at the surface of the Al type metal. By increasing the flow rate of the $CHF_3$, the etching speed of the TiN film is lowered. Therefore, under this condition, etching may be effected for the Si oxide layer and stopped in the TiN.

Figure 1C:
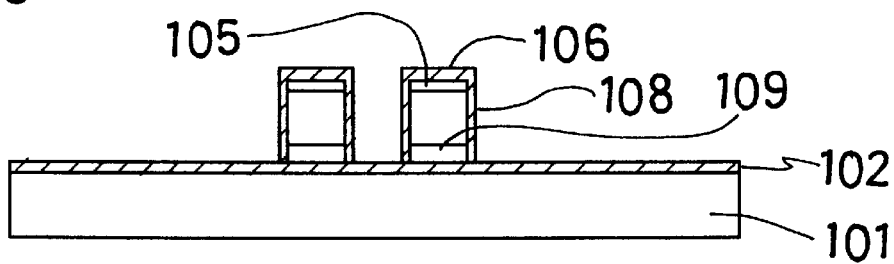
Figure 2:
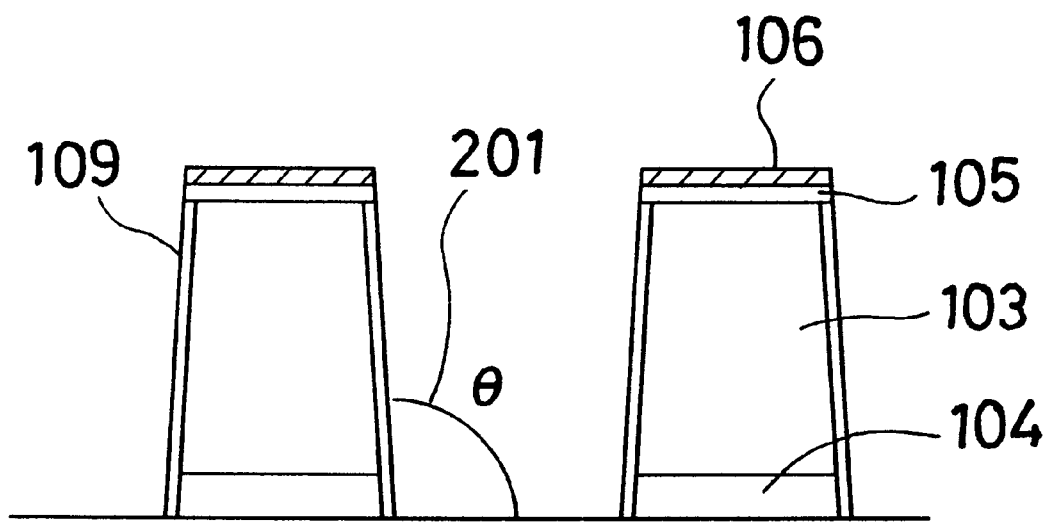
FIG. 2 is a section showing a taper angle of wiring.

Subsequently, as shown in FIG. 1C, with removing the resist pattern 107 and taking the patterned Si oxide layer 106, the Al type metal is etched. 10 to 30 SCCM of $BCl_3$, 40 to 70 SCCM of $Cl_2$ and 10 to 30 SCCM of $N_2$ are introduced as the gas system. At this time, as shown in FIG. 1C, Si oxide layer 106 is also etched slightly to form about 5 to 20 nm of side wall protective layer consisted of Al, Si, O and N is formed on the side wall 108 of the Al type wiring. A sectional shape of the wiring is ascending taper shaped configuration. FIG. 2 shows the tapered section of the wire.

Figure 1D:
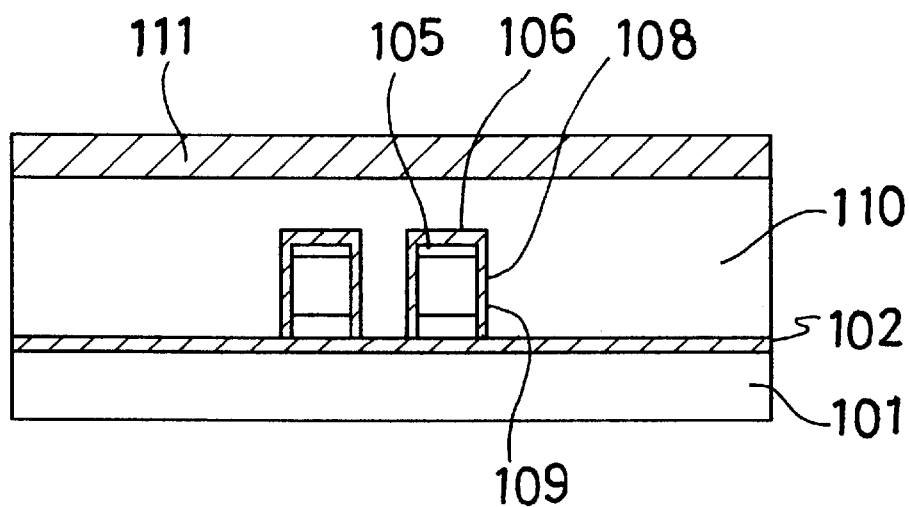

Subsequently, as shown in FIG. 1D, 600 nm to 2000 nm of the SiOF layer 110 is deposited. The SiOF layer 110 is grown by introducing TEOS or $SiH_4$ type gas and fluorine type gas ($C_2F_6$, TEFS or the like), oxygen, helium into the normal parallel plate plasma CVD (PE-CVD) system. A fluorine concentration in the SiOF layer when TEOS and $C_2F_6$ are used, is adjusted to be 5 to 10 atom % by a deposition power, temperature, a material gas flow rate and so forth. Particularly, TEOS material gas is adjusted to be 50 to 200 SCCM, $C_2F_6$ gas is adjusted to be 300 to 600 SCCM, oxygen is adjusted to be 500 to 2000 SCCM, the RF power is adjusted to be 800 to 1000W, and a substrate temperature is adjusted to be 300 to 400° C. Since the wiring is in ascending tapered shape in cross-section, even in the wiring interval less than or equal to 0.25 $\mu$m, the SiOF layer 110 can be buried without forming any gap. Subsequently, the step on the wiring is planarized by CMP (Chemical Mechanical Polishing) process or an etching back process after application of a planarizing layer, such as SOG layer, photoresist layer or so forth. Furthermore, over the entire surface, an Si oxide layer 111 as anti-hygroscopic cap layer is deposited in a thickness about 50 to 100 nm.

Figure 1E:
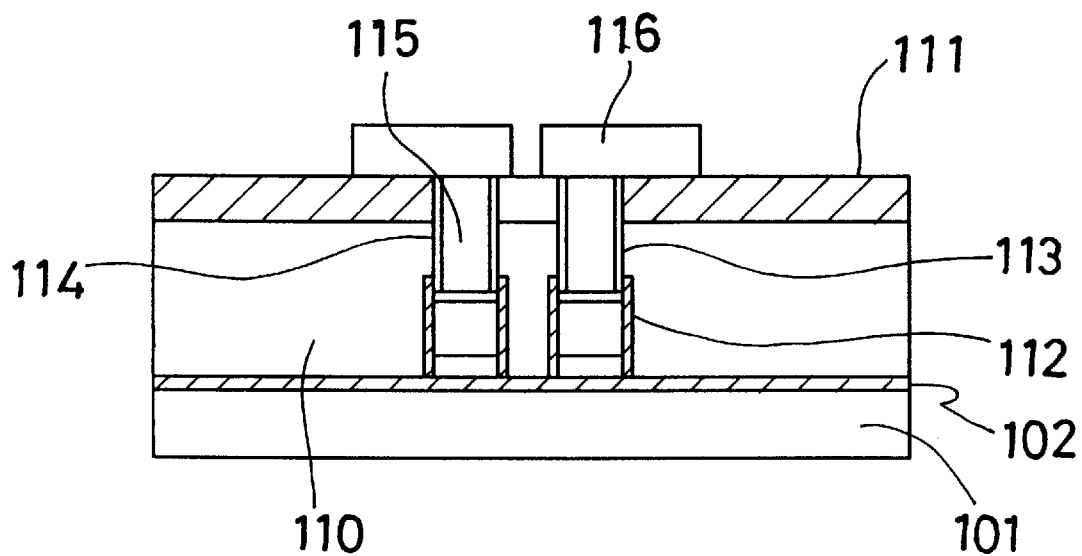

Subsequently, as shown in FIG. 1E, a through hole 113 is formed on the wiring through a known lithography and etching process. Subsequently, TiN, TiN/Ti or the like as the junction barrier metal 114 is formed by sputtering method or CVD method. Thereafter, by CVD method and etching back method, a metal plug 115 of W or the like is formed. Over the entire surface, a second Al wiring 116 is formed. In case of increasing further layers, similar processes as those set forth above are repeated.

Figure 3:
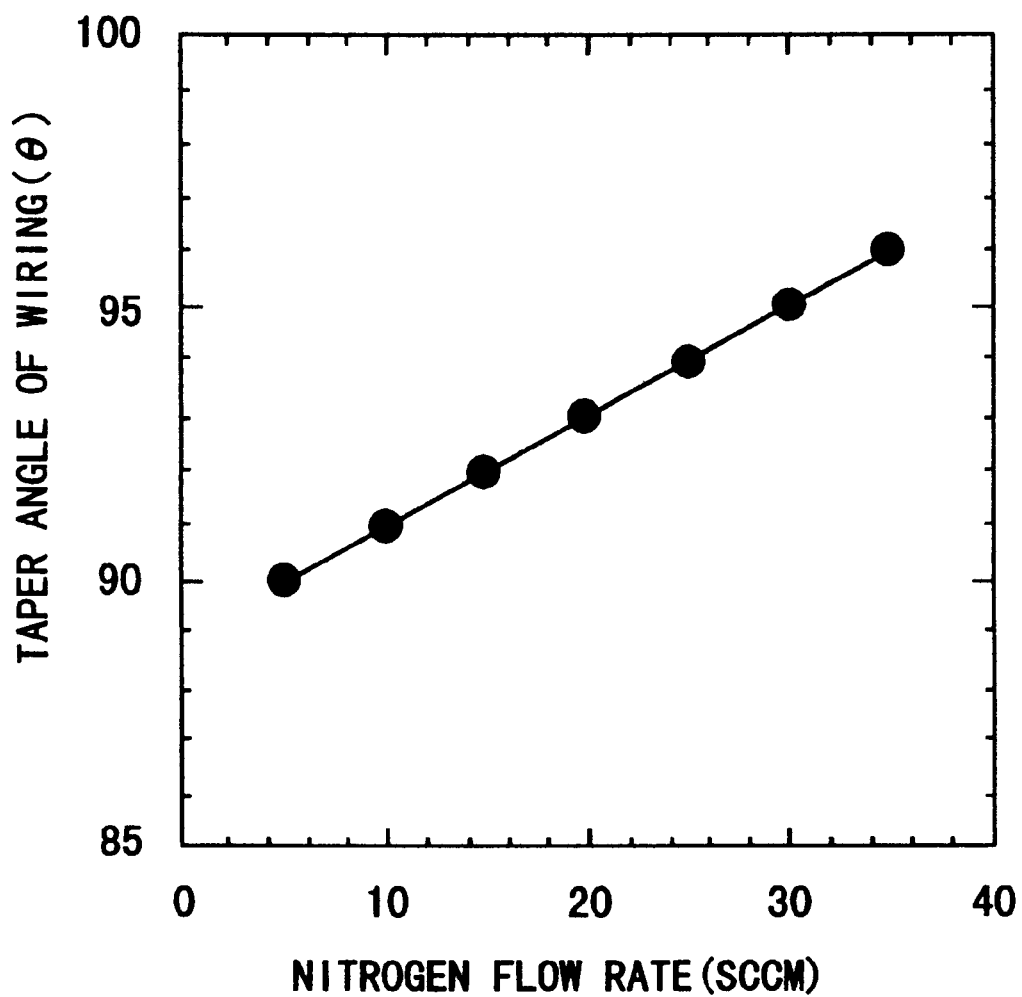
FIG. 3 is a characteristic chart showing a relationship between a nitrogen flow rate and taper angle of the wiring.
Figure 4:
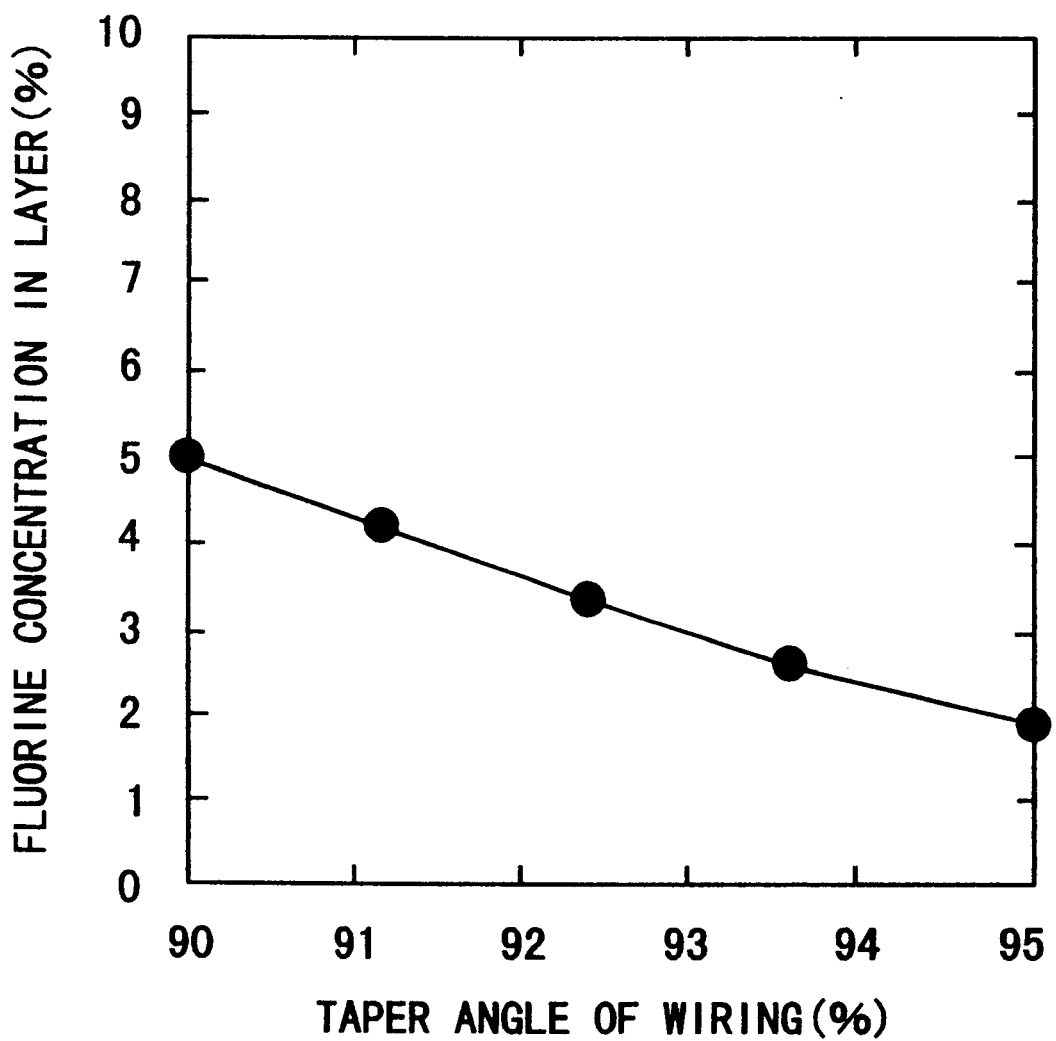
FIG. 4 is a characteristic chart showing a relationship between the taper angle of the wiring and fluorine concentration in a layer.

Next, further detailed discussion will be given for the etching shape and fluorine concentration in the SiOF layer under the etching condition of the wiring. When a high density plasma source, such as ICP, helicon wave or so forth are used as the plasma source, the Al type metal can be etched with the Si oxide layer as a mask by introducing $BCl_2/Cl_2/N_2$ type gas. When such gas is used, when a flow ratio of nitrogen is increased, the side wall protection layer 109 depositing on the side wall portion is increased to make a taper angle 201 of the wiring (FIG. 2) large. A relationship between the nitrogen flow rate and the taper angle of the wiring is illustrated in FIG. 3.

By making the nitrogen flow rate variable within a range of 5 to 35 SCCM, the taper angle 201 of the wiring of the space portion becomes variable in the extent of 90° to 95°. When the taper angle is 90°. about 5% of fluorine concentration becomes minimum at the lowest in order to completely bury the SiOF layer within the space portion of less than or equal to 0.25 $\mu$. In the case where the taper angle is about 95°, the fluorine concentration of about 2% is required for completely burying. As set forth above, by using Si oxide layer as a mask for etching of the Al type metal, the taper angle 209 of the wiring can be variable. Furthermore, the side wall protective layer 109 can also serve as a barrier for preventing diffusion of fluorine within the SiOF layer into the Al type wiring. Accordingly, without depositing Si oxide layer, the SiOF layer an be directly deposited. Therefore, good burying ability and low dielectric constant as the SiOF layer can be maintained. It should be noted that while foregoing gas system is used in the present invention, the gases are not specified to the shown examples.

The function of the first embodiment of the present invention will be discussed. In the multilayer wiring structure of the semiconductor device to be obtained through the first embodiment of the fabrication process, since the Si oxide layer 106 is present between the SiOF layer 110 and the anti-reflection layer 105, the SiOF layer 110 and the anti-reflection layer 105 are not in direct contact. By this, since fluoride of Ti is not formed on the surface of TiN as the anti-reflection layer 105, peeling is never caused on the surface of the TiN layer.

In contrast to this, in case of the prior art, in which the SiOF layer is formed directly on the TiN as the anti-reflection layer 105, the SiOF layer is easily peeled off TiN when the fluorine concentration in the layer exceeds 5 at % to be close to 10 at %. Particularly, on a wide wiring pattern, the SiOF layer is peeled from TiN layer to be lifted on a lens.

Thus, by providing Si oxide layer 106 between the SiOF layer 110 and the anti-reflection layer 105, possibility of failure of bonding of TiN is unnecessary to fear.

Furthermore, in the SiOF layer of high fluorine concentration, fluorine may diffuse during a process, such as heat treatment and so forth to cause corrosion by reaction with the Al type wiring. In the first embodiment of the present invention, since the surface of the wiring is covered with Si oxide layer 106 and the wide wall protection layer 109, these layers serve as barrier layers of fluorine. Before deposition of the SiOF layer after formation of wiring, it becomes unnecessary to form Si oxide layer or the like as the barrier later of fluorine. Accordingly, by foregoing Si oxide layer as the barrier layer for fluorine in advance, the shape between the wiring becomes reversed tapered shape before deposition of the SiOF layer to prevent burying of the SiOF layer from being interfered. For example, when the taper angle 201 of the section becomes 92° in the overall layer thickness of the wiring layer thickness of 0.5 μm, and when Si oxide layer is to be buried by the SiOF layer of 6 at % of fluorine deposited by PE-CVD with TEOS, $C_2F_6$ gas after formation of Si oxide layer in a thickness of 100 nm by PE-CVD method, gap can be formed between wiring even at the wiring interval of 0.5 μm. In contrast to this, when the SiOF layer is directly formed without Si oxide layer, it becomes possible to bury the space even the wiring internal is less than or equal to 0.25 μm. In order to bury the space of 0.25 μm with the SiOF layer after deposition of 100 nm of Si oxide layer, it becomes necessary to set fluorine concentration to be greater than or equal to 10 at %.

Since the SiOF layer having high fluorine concentration has high moisture absorbing characteristics, problem can be easily caused in the subsequent process. In the device which does not require to significantly lower dielectric constant, it is preferred not to excessively add fluorine. By employing the preferred process according to the present invention, even with the SiOF layer having low fluorine concentration, the fine wiring interval can be buried to minimize adverse effect of moisture or fluorine in the SiOF layer. Also, in the present invention, since all of the intervals between wiring are buried by the SiOF layer having lower dielectric constant than that of Si oxide layer, a parasitic capacitance between wiring can be made smaller than that caused upon stacking with Si oxide layer. Conversely, when it is acceptable to have parasitic capacitance equivalent to that of Si oxide layer and stacked structure, the SiOF layer of low fluorine concentration superior in reliability can be used.

[Second Embodiment]

Figure 5A:
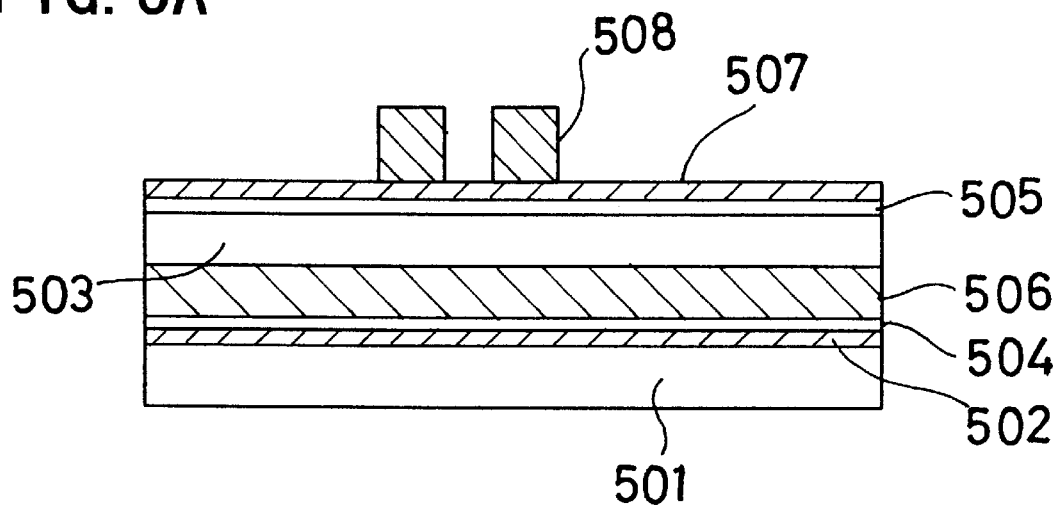
FIGS. 5A to 5C are sections of the second embodiment of the present invention showing a fabrication process in a sequential order of process steps.
Figure 5B:
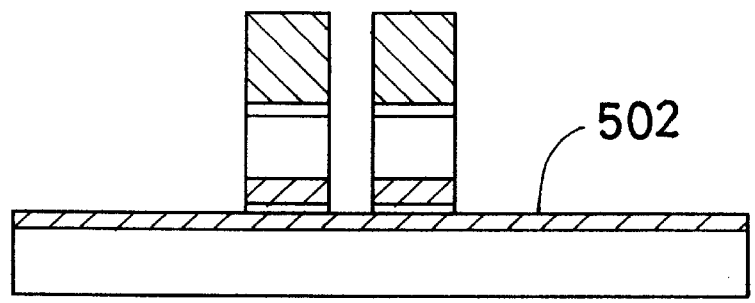
Figure 5C:
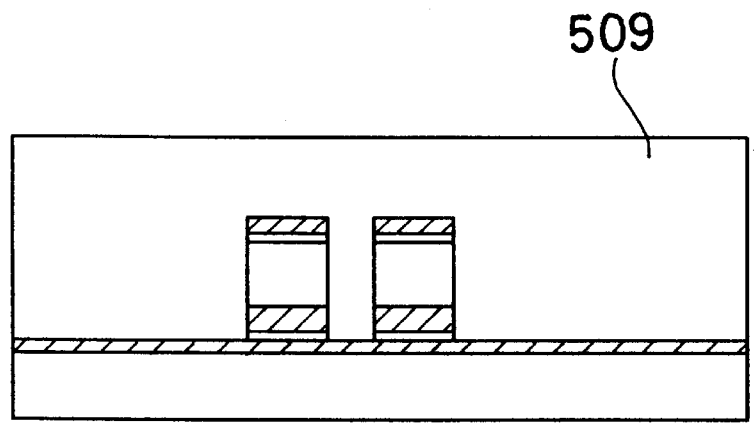
Figure 6:
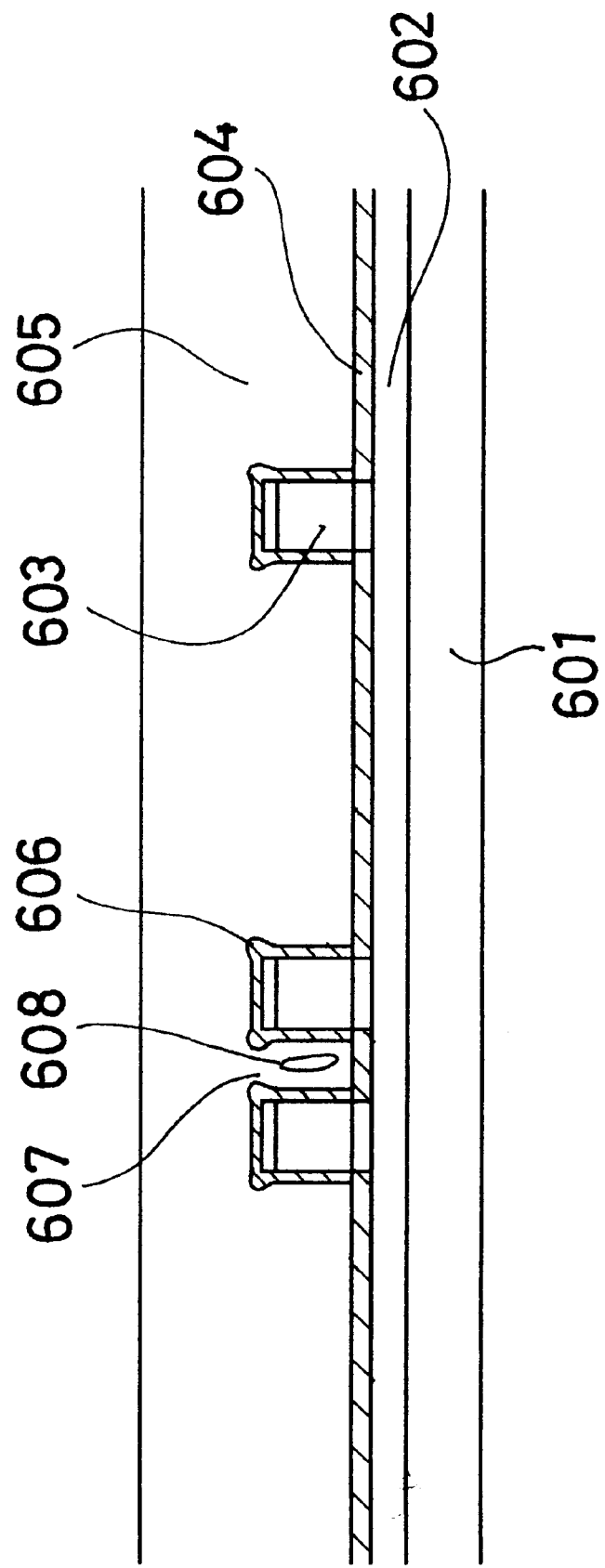
FIG. 6 is a section showing the prior art.

Next, discussion will be given for the second embodiment of the present invention with reference to the drawings. FIGS. 5A to 5C are section of major process steps of the second embodiment of the present invention. In the shown embodiment, the wiring is formed by stacked structure of the Al type metal and W.

As shown in FIG. 5A, on an Si oxide layer 502 of an Si substrate formed with transistors and so forth, 400 to 500 nm of Al type metal for wiring is deposited by sputtering. Below this wiring 503, as a junction barrier metal layer 504, respectively 50 nm and 100 nm of Ti and TiN are respectively deposited by sputtering in sequential order. Thereafter, W layer 506 is deposited in a thickness of 100 to 200 nm by a low pressure CVD method. On the Al type metal layer 503, TiN serving as an anti-reflection layer 505 upon lithography is deposited by sputtering in a thickness of 25 to 50 nm.

Subsequently, as shown in FIG. 5B, an Si oxide layer 507 is deposited in a thickness of 150 to 300 nm by way of sputtering or CVD. In order to form a wiring pattern, a photoresist layer 508 is applied on the Si oxide layer 507 in a thickness of about 2 μm. The photoresist layer 508 is patterned through a known lithographic process. With taking the photoresist layer 508 as a mask, the Si oxide layer 507, the anti-reflection layer 505, the Al type metal 503, the W layer 506 and the junction barrier metal layer 504 are etched in sequential order. Etching conditions are switched for respectively known optimal conditions depending upon respective materials. In this structure, if the photoresist later 508 is removed after etching of the Si oxide layer 507 and etching of the W layer 506 is performed using fluorine type gas, the Si oxide layer 507 is also etched in this etching condition. Therefore, the photoresist layer 508 cannot be removed until completion of etching of the W layer 506.

In the shown embodiment, since etching is performed under the known condition with taking the photoresist layer as a mask, a protective layer cannot be formed on the side wall of the wiring and the cross-sectional shape of the wiring cannot be ascending taper. Accordingly, if an SiOF layer 509 is deposited under the same condition as that of the first embodiment, it is not possible to bury fine space as that can be in the first embodiment. By progressing etching simultaneously by applying an RF bias to the substrate during layer deposition by HDP-CVD method, it becomes possible to bury the SiOF layer 509 even in the fine wiring interval. A condition of layer deposition of the SiOF layer 509 by HDP-CVD method is to introduce 20 to 40 SCCM of $SiH_4$, 20 to 40 SCCM of $SiF_4$, 20 to 40 SCCM of oxygen, 20 to 40 SCCM of Ar into the chamber and to generate a plasma using a power of an RF source of about 3000 W to form the SiOF layer in a thickness of 1 to 2 μm by applying a bias power of 1000 to 1500 W (FIG. 5C). Subsequently, similarly to the foregoing first embodiment, planarization is performed by CMP method, a through hole is formed, a first Al wiring is formed and then formation of two layer of Al wiring layers is completed.

In the shown embodiment, while the protective layer is not formed on the side wall of the wiring as the barrier layer of fluorine, the SiOF layer formed by HDP-CVD method is difficult to remove fluorine than SiOF layer formed by PE-CVD method. Corrosion of Al by fluorine is not necessary to fear. Accordingly, the effect to be expected in the shown embodiment is only improvement of bonding ability with the anti-reflection layer.

In the foregoing two embodiments, discussion has been given for the case where TiN is formed on the surface of the anti-reflection layer, the layer to be formed on the surface of the anti-reflection layer is not limited to TiN. When a layer containing Ti, such as Ti or TiW, forms the uppermost surface, if the SiOF layer is formed directly, fluoride of Ti can be formed on the surface to degrade bonding ability. Therefore, the shown embodiments are effective even for Ti and TiW. Also, since W layer is also has low bonding ability with the SiOF layer, the present invention is also effective for W.

Furthermore. TiN or TiW are frequently used as the barrier layer of Cu. Therefore, the present invention is also effective for Cu wiring.

On the other hand, as the insulation layer on the anti-reflection layer, it is not limited to the Si oxide layer. As gas added fluorine to be used upon deposition of SiOF layer, in addition to $C_2F_6$, $SiF_4$, $NF_3$, $CF_4$, TEFS and so forth may be used.

As set forth above, according to the present invention, bonding ability of the SiOF layer on the wiring can be improved. The reason is that, since the Si oxide layer is formed between the SiOF layer and the TiN anti-reflection layer, the TiN anti-reflection layer and the SiOF layer are not directly contact.

Furthermore, burying ability of SiOF layer of low fluorine concentration between wiring can be improved. The reason is that since etching of the wiring metal is performed with taking the Si oxide layer pattern as mask, the cross-sectional shape of the wiring can be ascending taper. Also, the taper angle can be varied by varying the etching condition. Furthermore, since SiOF layer can be deposited without depositing Si oxide layer.

In addition, reliability of the wiring in the SiOF layer can be improved. The reason is that the wiring metal can be etched utilizing the Si oxide layer pattern. Therefore, the side wall protective layer for prevention of diffusion of fluorine can be formed on the side wall of the wiring.

Also, the SiOF layer is certainly provided low dielectric constant. The reason is that SiOF layer can be deposited without depositing Si oxide layer.

Although the present invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

What is claimed is:

1. A fabrication process of a semiconductor device comprising:

a metal layer forming step of forming a metal layer to be a base of wiring on a semiconductor substrate, with taking Al as a primary component;

an anti-reflection layer forming step of forming an anti-reflection layer of a refractory metal or compound thereof, on said metal layer;

an insulation layer forming step of forming an insulation layer of Si oxide layer or Si nitride layer on said anti-reflection layer;

an insulation layer patterning step of patterning said insulation layer;

a wiring pattern step of performing patterning of the wiring by etching said anti-reflection layer and said metal layer to be the base of the wiring with taking the patterned insulation layer as a mask with leasing said anti-reflection layer and said insulation layer on said wiring in conjunction with etching a part of said insulation layer with forming protective layer containing Si and Al on side wall of said wiring; and an SiOF layer burying step of burying the patterned wiring with an SiOF layer as an Si oxide later containing fluorine, together with said anti-reflection layer and said insulation layer on the upper surface.

2. A fabrication process of a semiconductor device as set forth in claim 1, wherein said insulation layer patterning step comprises a step of performing patterning of said insulation layer with taking a photoresist as a mask, and a step of removing said photoresist.

3. A fabrication process of a semiconductor device as set forth in claim 1, wherein said insulation layer patterning step comprises a step of simultaneously patterning said insulation layer and said anti-reflection layer with taking a photoresist as a mask, and a step of removing said photoresist.

4. A fabrication process of a semiconductor device as set forth in claim 1, wherein said insulation layer forming step forms said Si oxide layer or said Si nitride layer by way of sputtering or CVD method.

5. A fabrication process of a semiconductor device as set forth in claim 1, wherein said anti-reflection layer forming step deposits any one of Ti, W, TiN and TiW by way of sputtering.

6. A fabrication process of a semiconductor device as set forth in claim 1, wherein said anti-reflection layer forming step deposits a plurality components selected among Ti, W, TiN and TiW by way of sputtering.

7. A fabrication process of a semiconductor device as set forth in claim 1, wherein said metal layer forming step deposits a metal containing Al as a major component, and said wiring patterning step is performed by dry etching with a gas under a condition where a tapered side wall is formed with being formed a protective layer on the side wall of said wiring metal by etching.

8. A fabrication process of a semiconductor device comprising the steps of:

forming a metal layer to be a base of wiring on a semiconductor substrate, with taking Al as a primary component;

forming an anti-reflection layer of a refractory metal or compound thereof, on said metal layer;

forming an insulation layer comprising at lease one of a Si oxide layer and a Si nitride layer on said anti-reflection layer;

patterning said insulation layer;

performing patterning of the wiring by etching said anti-reflection layer and said metal layer to be the base of the wiring by utilizing the patterned insulation layer as a mask with said anti-reflection layer and said insulation layer on said wiring in conjunction with etching a part of said insulation layer and with forming a protective layer containing Si and Al on a side wall of said wiring; and burying the patterned wiring with an SiOF layer as an Si oxide later containing fluorine, together with said anti-reflection layer and said insulation layer on the upper surface.

9. A fabrication process of a semiconductor device as set forth in claim 8, further comprising the steps of:

performing the patterning of said insulation layer by utilizing a photoresist as a mask, and removing said photoresist.

10. A fabrication process of a semiconductor device as set forth in claim 8, wherein said insulation layer patterning step further comprises the steps of:

simultaneously patterning said insulation layer and said anti-reflection layer by utilizing a photoresist as a mask, and removing said photoresist.

11. A fabrication process of a semiconductor device as set forth in claim 8, further comprising the step of:

forming at least one of said Si oxide layer and said Si nitride layer by utilizing at least one of a sputtering and a CVD technique.

12. A fabrication process of a semiconductor device as set forth in claim 8, further comprising the step of:

forming said anti-reflection layer by depositing one of Ti, W, TiN and TiW by utilizing a sputtering technique.

13. A fabrication process of a semiconductor device as set forth in claim 8, further comprising the step of:

forming said anti-reflection layer by depositing a plurality of components selected from at least one of Ti, W, TiN and TiW by utilizing a sputtering technique.

14. A fabrication process of a semiconductor device as set forth in claim 8, further comprising the steps of:

forming said metal layer by depositing a metal containing Al as a major component, and performing said wiring patterning step by dry etching with a gas so as to form a tapered side wall and forming a protective layer on the side wall of said wiring metal by etching.

* * * * *